(12) United States Patent
Komatsu

(10) Patent No.: US 11,050,218 B2
(45) Date of Patent: Jun. 29, 2021

(54) METHOD TO TUNE EMISSION WAVELENGTH OF LASER APPARATUS

(71) Applicant: SUMITOMO ELECTRIC DEVICE INNOVATIONS, INC., Yokohama (JP)

(72) Inventor: Kento Komatsu, Yokohama (JP)

(73) Assignee: Sumitomo Electric Device Innovations, Inc., Yokohama (JP)

(*) Notice: Subject to any disclaimer, the term of this patent is extended or adjusted under 35 U.S.C. 154(b) by 38 days.

(21) Appl. No.: 16/722,190

(22) Filed: Dec. 20, 2019

(65) Prior Publication Data

US 2020/0212650 A1 Jul. 2, 2020

(30) Foreign Application Priority Data

Dec. 27, 2018 (JP) .............................. JP2018-244140

(51) Int. Cl.
*H01S 5/0687* (2006.01)
(52) U.S. Cl.
CPC .................................. *H01S 5/0687* (2013.01)
(58) Field of Classification Search
CPC ...... H01S 5/0687; H01S 5/0617; H01S 5/068; H01S 5/141
See application file for complete search history.

(56) References Cited

U.S. PATENT DOCUMENTS 10,461,493 B2 * 10/2019 Xiong ................. H01S 3/08027

FOREIGN PATENT DOCUMENTS

JP 2005-032968 A 2/2005
JP 2010-034114 A 2/2010

* cited by examiner

*Primary Examiner* — Armando Rodriguez
(74) *Attorney, Agent, or Firm* — Baker Botts L.L.P.; Michael A. Sartori

(57) ABSTRACT

A method includes steps of: acquiring a target wavelength; acquiring a drive condition of a wavelength tunable laser diode; driving the wavelength tunable laser diode based on the drive condition; acquiring a measured value of the first current measured by a first photodetector, a measured value of a second current measured by a second photodetector and a measured value of the drive condition; determining the measured value of the first current as a first target value; calculating a second target value of the second current from the measured value of the drive condition and the target value of the first current; and coinciding a ratio of the measured value of the first current with respect to the measured value of the second current, to a ratio of the first target of the first current with respect to the second target of the second current, by changing the drive condition.

5 Claims, 9 Drawing Sheets

FIG. 3

| Ch | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $P_O$ [mW] |
|---|---|---|---|---|---|---|---|---|
| | | | INITIAL SETTING VALUE | | | | | FEEDBACK CONTROL TARGET VALUE |
| 1 | 150.00 | 67.39 | 52.508 | 50.000 | 29.42 | 57.47 | 50.69 | 315.0 |
| 2 | 150.00 | 47.74 | 34.533 | 50.000 | 64.38 | 81.31 | 72.45 | 317.5 |
| 3 | 150.00 | 50.86 | 38.727 | 50.000 | 59.05 | 77.71 | 69.12 | 313.0 |
| ... | ... | ... | ... | ... | ... | ... | ... | ... |
| n | 150.00 | 54.77 | 54.046 | 50.000 | 41.24 | 43.32 | 11.69 | 317.2 |

FIG. 6

| Ch | a1 [A/mW] | b1 [A/mW] | c1 [A] | a2 [A/mW] | b2 [A/mW] | c2 [A] | a3 [A/mW] | b3 [A/mW] | c3 [A] |
|---|---|---|---|---|---|---|---|---|---|
| 1 | 1.31 | 131 | 332 | 3.60 | 132 | 446 | ...... | ...... | ...... |
| 2 | -0.24 | 137 | 245 | -3.34 | 168 | 73 | | | |
| 3 | 0.56 | 140 | 292 | 2.95 | 137 | 430 | | | |
| ... | ... | ... | ... | ... | ... | ... | | | |
| n | 0.04 | 152 | 268 | -2.55 | 179 | 11 | | | |

METHOD TO TUNE EMISSION WAVELENGTH OF LASER APPARATUS

CROSS-REFERENCE TO RELATED APPLICATION

This application is based upon and claims the benefit of priority of the prior Japanese Patent Application No. 2018-244140, filed on Dec. 27, 2018, the entire contents of which are incorporated herein by reference.

BACKGROUND

(i) Technical Field

The present invention relates to a method to tune an emission wavelength of a laser apparatus.

(ii) Related Art

For example, there is known wavelength tunable laser apparatuses which use a wavelength tunable laser diode such as a semiconductor laser and use an etalon as a wavelength locker. Characteristic of the etalon varies in accordance with a temperature. And so, there is disclosed a technology in which the laser diode and the etalon are mounted on a temperature adjusting element (TEC: Thermoelectric cooler) and the temperature of the laser diode and the temperature of the etalon are adjusted (for example, see Japanese Patent Application Publication No. 2010-34114 and Japanese Patent Application Publication No. 2005-032968).

SUMMARY

However, the wavelength tunable laser diode acts as a heat source. Heat is conducted to the etalon. Thus, the characteristic of the etalon fluctuates. It is therefore difficult to control the wavelength. And so, the purpose of the present invention is to provide a method to tune an emission wavelength of a laser apparatus that is capable of controlling a wavelength with high accuracy.

According to an aspect of the present invention, there is provided a method to tune an emission wavelength of a laser apparatus that includes a wavelength tunable laser diode that emits laser beam, an etalon that receives emitted laser beam of the wavelength tunable laser diode and changes transmissivity in accordance with a wavelength of the emitted laser beam, a first photodetector that outputs a first current based on the emitted laser beam that is output from the wavelength tunable laser diode, a second photodetector that outputs a second current based on a transmitted light that is output from the etalon, the method including steps of: acquiring a target wavelength of the wavelength tunable laser diode to make the wavelength tunable laser diode oscillate at a target wavelength; acquiring a drive condition of the wavelength tunable laser diode based on the target wavelength; driving the wavelength tunable laser diode based on the drive condition of the wavelength tunable laser diode; acquiring a measured value of the first current measured by the first photodetector, a measured value of the second current measured by the second photodetector and a measured value of the drive condition of the wavelength tunable laser diode; determining the measured value of the first current measured by the first photodetector as a first target value of the first photodetector; calculating a second target value of the second current from the measured value of the drive condition and the target value of the first current; and coinciding a ratio of the measured value of the first current measured by the first photodetector with respect to the measured value of the second current measured by the second photodetector, to a ratio of the first target of the first current with respect to the second target of the second current, by changing the drive condition.

According to another aspect of the present invention, there is provided a method to tune an emission wavelength of a laser apparatus that includes a wavelength tunable laser diode that emits laser beam, an etalon that receives emitted laser beam of the wavelength tunable laser diode and changes transmissivity in accordance with a wavelength of the emitted laser beam, a first photodetector that outputs a first current based on the emitted laser beam that is output from the wavelength tunable laser diode, a second photodetector that outputs a second current based on a transmitted light that is output from the etalon, the method including steps of: acquiring a target value of an optical magnitude and a target value of a wavelength of the emitted laser beam of the wavelength tunable laser diode; acquiring a drive condition based on the target wavelength of the wavelength tunable laser diode; calculating a target value of the drive condition of the wavelength tunable laser based on the target value of the optical magnitude of the emitted laser beam; calculating a target value of the first current of the first photodetector and a target value of the second current of the second photodetector from the target value of the optical magnitude and the drive condition of the target wavelength of the wavelength tunable laser diode; acquiring each measured value of the first and second current measured by the first and second of photodiode; and coinciding a ratio of the first current measured by the first photodetector with respect to the second current measured by the second photodetector, to a ratio of the target value of the first current with respect to the target value of the second current by changing the drive condition.

BRIEF DESCRIPTION OF THE DRAWINGS

FIG. 3 illustrates initial setting values and feedback control target values;

FIG. 6 illustrates parameters;

DETAILED DESCRIPTION

Figure 1:
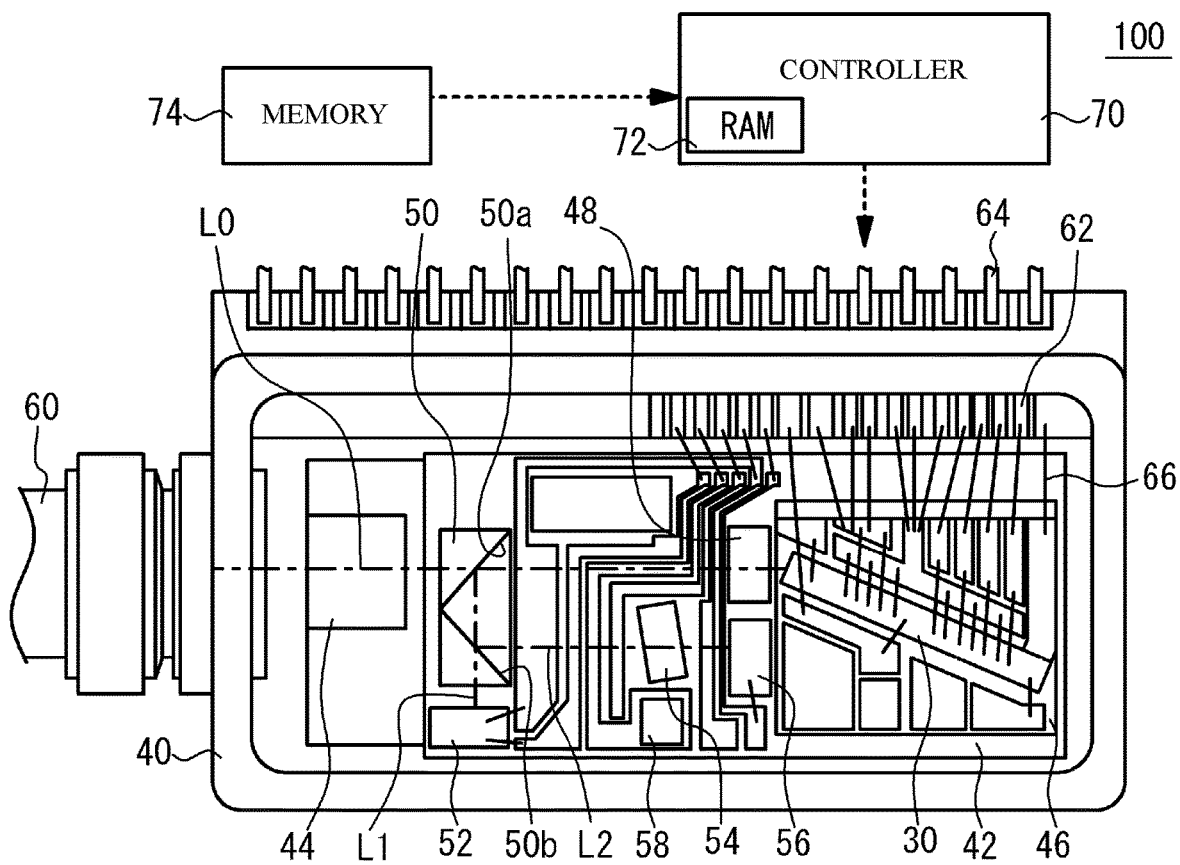
FIG. 1 schematically illustrates a wavelength tunable laser apparatus in accordance with a first embodiment.

Description of Embodiments of the Present Invention

First, the subject matter of an embodiment of the present invention is described as listed below.

An embodiment of the present invention is (1) a method to tune an emission wavelength of a laser apparatus that includes a wavelength tunable laser diode that emits laser beam, an etalon that receives emitted laser beam of the wavelength tunable laser diode and changes transmissivity in accordance with a wavelength of the emitted laser beam, a first photodetector that outputs a first current based on the emitted laser beam that is output from the wavelength tunable laser diode, a second photodetector that outputs a second current based on a transmitted light that is output from the etalon, the method including steps of: acquiring a target wavelength of the wavelength tunable laser diode to make the wavelength tunable laser diode oscillate at a target wavelength; acquiring a drive condition of the wavelength tunable laser diode based on the target wavelength; driving the wavelength tunable laser diode based on the drive condition of the wavelength tunable laser diode; acquiring a measured value of the first current measured by the first photodetector, a measured value of the second current measured by the second photodetector and a measured value of the drive condition of the wavelength tunable laser diode; determining the measured value of the first current measured by the first photodetector as a first target value of the first photodetector; calculating a second target value of the second current from the measured value of the drive condition and the target value of the first current; and coinciding a ratio of the measured value of the first current measured by the first photodetector with respect to the measured value of the second current measured by the second photodetector, to a ratio of the first target of the first current with respect to the second target of the second current, by changing the drive condition. With the method, it is possible to acquire a target value corresponding to a target wavelength in accordance with heat caused by driving of the wavelength tunable laser diode. It is possible to control the wavelength with high accuracy, with use of the target value.

(2) The wavelength tunable laser diode may have an optical semiconductor amplifier that adjusts an optical magnitude of the laser beam that is output by a laser region of the wavelength tunable laser diode. The step of acquiring the drive condition of the wavelength tunable laser diode may include steps of: acquiring a value of an electrical signal input into the optical semiconductor amplifier. The step of calculating the second target value of the second photodetector may include steps of: calculating the second target value of the second current based on the measured value of the first current measured by the first photodetector and the value of the electrical signal of the optical semiconductor amplifier. It is possible to control the wavelength with high accuracy because the target value in accordance with the heat caused by driving of the optical semiconductor amplifier is acquired.

(3) The value of the electrical signal of the optical semiconductor amplifier may be electrical power that is input to the optical semiconductor amplifier. It is possible to control the wavelength with high accuracy, because the target value in accordance with the heat caused by driving the optical semiconductor amplifier caused by supplying of electrical power is acquired.

Another embodiment of the present invention is (4) a method to tune an emission wavelength of a laser apparatus that includes a wavelength tunable laser diode that emits laser beam, an etalon that receives emitted laser beam of the wavelength tunable laser diode and changes transmissivity in accordance with a wavelength of the emitted laser beam, a first photodetector that outputs a first current based on the emitted laser beam that is output from the wavelength tunable laser diode, a second photodetector that outputs a second current based on a transmitted light that is output from the etalon, the method including steps of: acquiring a target value of an optical magnitude and a target value of a wavelength of the emitted laser beam of the wavelength tunable laser diode; acquiring a drive condition based on the target wavelength of the wavelength tunable laser diode; calculating a target value of the drive condition of the wavelength tunable laser based on the target value of the optical magnitude of the emitted laser beam; calculating a target value of the first current of the first photodetector and a target value of the second current of the second photodetector from the target value of the optical magnitude and the drive condition of the target wavelength of the wavelength tunable laser diode; acquiring each measured value of the first and second current measured by the first and second of photodiode; and coinciding a ratio of the first current measured by the first photodetector with respect to the second current measured by the second photodetector, to a ratio of the target value of the first current with respect to the target value of the second current by changing the drive condition. With the method, it is possible to acquire a target value corresponding to a target wavelength in accordance with heat caused by driving of the wavelength tunable laser diode. It is possible to control the wavelength with high accuracy, with use of the target value.

(5) The wavelength tunable laser diode may have an optical semiconductor amplifier that adjusts an optical magnitude of the laser beam that is output by a laser region of the wavelength tunable laser diode. The step of acquiring the drive condition of the wavelength tunable laser diode may include steps of: acquiring a target value of an electrical signal input into the optical semiconductor amplifier, as the drive condition. The step of calculating the target value of the first current and the target value of the second current may include steps of: calculating the target value of the first current and the target value of the second current from the target value of the electrical signal. It is possible to control the wavelength with high accuracy, because the target value in accordance with the heat caused by driving the optical semiconductor amplifier is acquired.

Details of Embodiments of the Present Invention

The following is a description of a specific example of a method to tune an emission wavelength of a laser apparatus according to an embodiment of the present invention, with reference to the drawings. It should be noted that the present invention is not limited to these examples but is shown by the claims, and it is intended that all modifications are included in the equivalents of the claims and the scope of the claims.

First Embodiment (Wavelength tunable laser apparatus) FIG. 1 schematically illustrates a wavelength tunable laser apparatus 100 in accordance with a first embodiment. As illustrated in FIG. 1, the wavelength tunable laser apparatus 100 has a wavelength tunable laser diode 30, a controller 70 and a memory 74. The wavelength tunable laser diode 30 is such as a laser diode (LD) of which a wavelength is tunable. The wavelength tunable laser diode 30 is mounted in a case 40. When a cap is provided on the case 40, inside of the case 40 is hermetically sealed. For example, the controller 70 and the memory 74 are arranged out of the case 40.

A temperature adjusting element 42 and a beam shifter 44 are arranged in the case 40. For example, the temperature adjusting element 42 includes a peltier element and acts as a TEC (Thermoelectric cooler). A base 46, a lens 48, a beam splitter 50, light receiving elements 52 and 56, an etalon 54 and a thermistor 58 are mounted on the temperature adjusting element 42. The wavelength tunable laser diode 30 is mounted on the base 46.

The wavelength tunable laser diode 30 emits a laser light L0 from an outputting end. The lens 48, the beam splitter 50 and the beam shifter 44 are provided on an optical path of the laser light L0 in this order. The wavelength tunable laser diode 30 is inclined with respect to an optical axis of the laser light L0. For example, an inclination angle of the wavelength tunable laser diode 30 with respect to the optical axis is 20 degrees to 60 degrees.

For example, the lens 48 is a collimate lens and converts the laser light L0 into a paralleled light. For example, the beam splitter 50 is formed by removing a triangle part from a rectangular prism and has two reflection faces 50a and 50b. The reflection faces 50a and 50b are inclined with respect to the optical axis of the laser light L0.

The beam splitter 50 branches the laser light L0 and generates laser lights L1 and L2. In concrete, the reflection face 50a permeates a part of the laser light L0 having passed through the lens 48. And, the reflection face 50a reflects the rest of the laser light L0. A part of the light reflected by the reflection face 50a permeates the reflection face 50b. The part of the light having passed through the reflection face 50b is the laser light L1. The rest of the light reflected by the reflection face 50a is reflected by the reflection face 50b. The rest is the laser light L2.

The laser light L1 is input to the light receiving element 52 (first photo detector). For example, the light receiving element 52 includes a photodiode. When the laser light L1 is input to the light receiving element 52, the light receiving element 52 outputs a current $I_{m1}$. The etalon 54 and the light receiving element 56 act as a second photo detector that outputs a current $I_{m2}$ in accordance with a wavelength of the laser light L1. The etalon 54 is a fixed etalon (solid etalon) and has wavelength characteristic of which a transmittance rate periodically changes in accordance with a wavelength of an input light. The wavelength characteristic changes in accordance with a temperature of the etalon 54. The laser light L2 passes through the etalon 54. After that, the laser light L2 is input to the light receiving element 56. The light receiving element 56 includes a photodiode and outputs a current $I_{m2}$ when the laser light L2 is input to the light receiving element 56.

That is, the current $I_{m1}$ and the current $I_{m2}$ are output, when the laser light L1 that does not pass through the etalon 54 is input to the light receiving element 52 and the laser light L2 that passes through the etalon 54 is input to the light receiving element 56. It is possible to control the output and the wavelength of the wavelength tunable laser apparatus 100 with use of the currents $I_{m1}$ and $I_{m2}$.

The laser light L0 having passed through the beam splitter 50 is input to an output port 60 via the beam shifter 44. The beam shifter 44 adjusts a horizontal level between the optical axis of the laser light L0 and the output port 60. An optical fiber having polarization-maintaining characteristic is connected to the output port 60. The laser light L0 is output via the optical fiber.

The thermistor 58 detects the temperature of the temperature adjusting element 42. The temperature adjusting element 42 controls the temperatures of the wavelength tunable laser diode 30 and the etalon 54 and so on, in accordance with the detected temperature.

The case 40 has a plurality of electrodes 62. The plurality of electrodes 62 are electrically connected to wiring patterns on the TEC 42 and wiring patterns on the base 46 via bonding wires 66. The wiring patterns are electrically connected to the wavelength tunable laser diode 30, the light receiving elements 52 or 56, the TEC 42, the thermistor 58 and so on. A plurality of lead pins 64 are exposed to outside of the case 40 and are electrically connected to the plurality of electrodes 62.

The controller 70 has a central processing unit (CPU), a random access memory (RAM) 72, an electrical power source and so on. The RAM 72 is a memory configured to temporally store program executed by the CPU, data processed by the CPU, and so on. The memory 74 is a rewritable memory device such as a flash memory. The controller 70, the RAM 72 and the memory 74 are mounted on a computer.

The controller 70 is electrically connected to the lead pins 64 and is electrically connected to inner devices in the wavelength tunable laser apparatus 100 via the electrodes 62, the bonding wires 66 and the wiring patterns and so on. The controller 70 inputs an electrical signal to the wavelength tunable laser diode 30 and the temperature adjusting element 42 and obtains a largeness of the electrical signal. The largeness of the electrical signal is such as a current or electrical power. The controller 70 obtains the temperature on the basis of an electrical resistance of the thermistor 58. The controller 70 obtains the currents $I_{m1}$ and $I_{m2}$ that are output by the light receiving elements 52 and 56.

The memory 74 associates initial setting values of each part of the wavelength tunable laser apparatus 100, coefficients for the wavelength control, feedback control target values and so on with each channel, and stores them. The channel described later on the basis of FIG. 3 is a number corresponding to each wavelength oscillation wavelength of the wavelength tunable laser diode 30. For example, each channel may correspond to each grid wavelength determined by ITU-T (International Telecommunication Union Telecommunication Standardization Sector) or may correspond to each channel other than the grid wavelengths.

Figure 2:
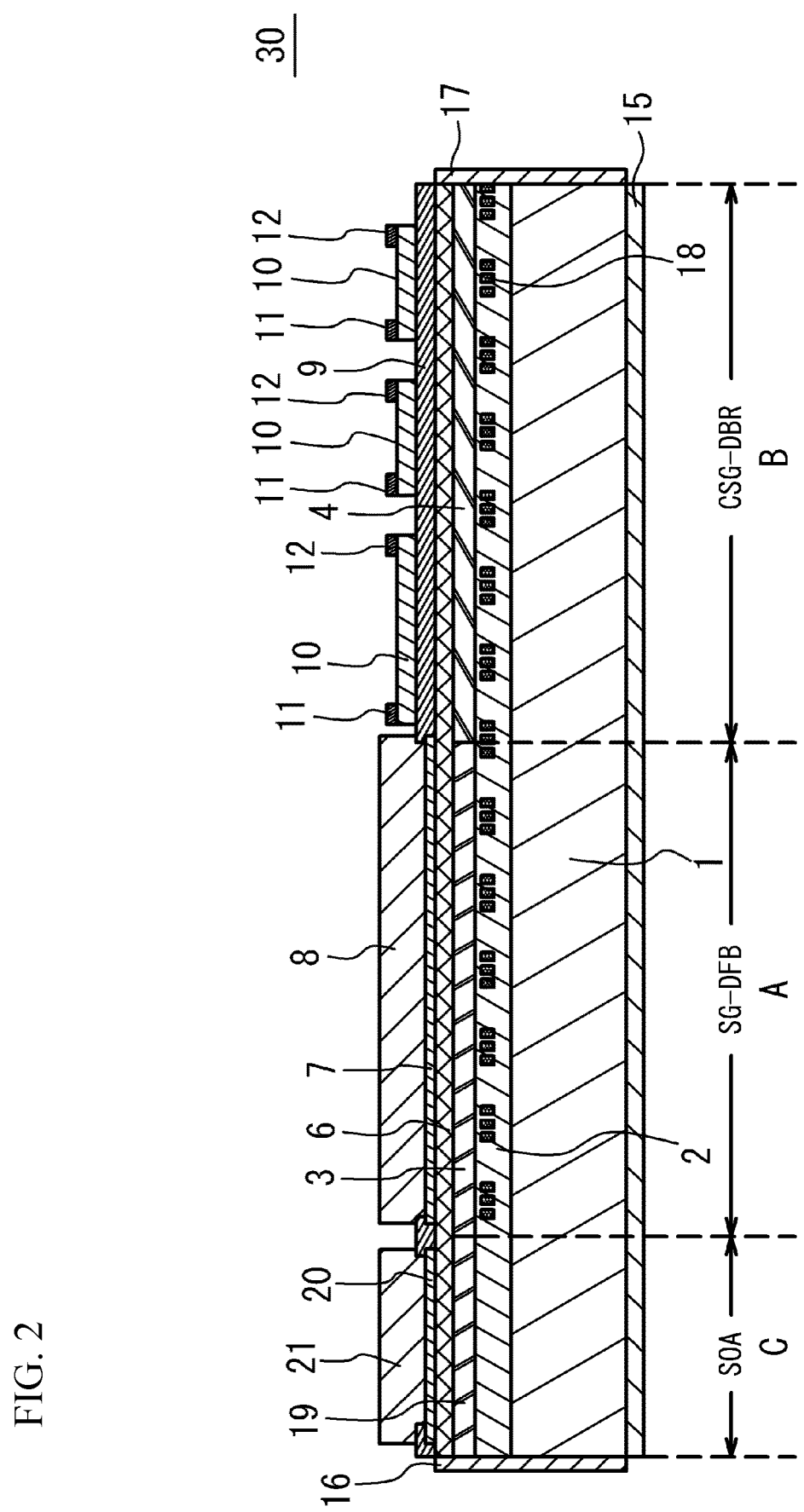
FIG. 2 illustrates a schematic cross sectional view of a wavelength tunable laser diode in accordance with a first embodiment.

(Wavelength tunable laser diode 30) FIG. 2 illustrates a schematic cross sectional view of the wavelength tunable laser diode 30 in accordance with a first embodiment. As illustrated in FIG. 2, the wavelength tunable laser diode 30 has a SG-DFB (Sampled Grating Distributed Feedback) region A, a CSG-DBR (Chirped Sampled Grating Distributed Bragg Reflector) region B, and an SOA (Semiconductor Optical Amplifier) region C (adjusting region). That is, the wavelength tunable laser diode 30 has wavelength selection mirrors in the semiconductor structure.

As an example, in the wavelength tunable laser diode 30, the SOA region C, the SG-DFB region A and the CSG-DBR region B are located in this order from the front side to the rear side. The SG-DFB region A achieves an optical gain and has sampled gratings. The CSG-DBR region B does not achieve an optical gain and has sampled gratings. The SOA region C faces toward the lens 48.

The SG-DFB region A has a structure in which a lower cladding layer 2, an active layer 3, an upper cladding layer 6, a contact layer 7 and an electrode 8 are laminated on a substrate 1. The CSG-DBR region B has a structure in which the lower cladding layer 2, an optical waveguide layer 4, the upper cladding layer 6, an insulating layer 9 and heaters 10 are laminated on the substrate 1. Each of the heaters 10 has a power supply electrode 11 and a ground electrode 12. The SOA region C has a structure in which the lower cladding layer 2, an optical amplification layer 19, the upper cladding layer 6, a contact layer 20 and an electrode 21 are laminated on the substrate 1.

The substrate 1, the lower cladding layer 2 and the upper cladding layer 6 are integrally formed in the SG-DFB region A, the CSG-DBR region B and the SOA region C. The active layer 3, the optical waveguide layer 4, and an optical amplification layer 19 are formed on the same plane. An interface between the SG-DFB region A and the CSG-DBR region B corresponds to an interface between the active layer 3 and the optical waveguide layer 4.

A facet film 16 is formed on an facet of the substrate 1, the lower cladding layer 2, the optical amplification layer 19 and the upper cladding layer 6 on the side of the SOA region C. In the embodiment, the facet film 16 is an AR (Anti Reflection) film. The facet film 16 acts as a front facet of the wavelength tunable laser diode 30. A facet film 17 is formed on a facet of the substrate 1, the lower cladding layer 2, the optical waveguide layer 4, and the upper cladding layer 6 on the side of the CSG-DBR region B. In the embodiment, the facet film 17 is an AR film. The facet film 17 acts as a rear facet of the wavelength tunable laser diode 30.

The substrate 1 is, for example, a crystal substrate made of n-type InP. The lower cladding layer 2 has n-type conductivity. The upper cladding layer 6 has p-type conductivity. The lower cladding layer 2 and the upper cladding layer 6 are, for example, made of InP. The lower cladding layer 2 and the upper cladding layer 6 confines a light in the active layer 3, the optical waveguide layer 4 and the optical amplification layer 19.

The active layer 3 is made of semiconductor having a gain. The active layer 3 may have a quantum well structure in which a well layer made of $Ga_{0.32}In_{0.68}As_{0.92}P_{0.08}$ having a thickness of 5 nm and a barrier layer made of $Ga_{0.22}In_{0.78}As_{0.47}P_{0.53}$ having a thickness of 10 nm are laminated alternately. The optical waveguide layer 4 is, for example, made of bulk semiconductor layer, and may be made of $Ga_{0.22}In_{0.78}As_{0.47}P_{0.53}$. In the embodiment, an energy gap of the optical waveguide layer 4 is larger than that of the active layer 3. The optical waveguide layer 4 is optically connected to the active layer 3.

The optical amplification layer 19 achieves a gain when a current is supplied from the electrode 21, and amplifies a light. The optical amplification layer 19 may have a quantum well structure in which a well layer made of $Ga_{0.35}In_{0.65}As_{0.99}P_{0.01}$ having a thickness of 5 nm and a barrier layer made of $Ga_{0.15}In_{0.85}As_{0.32}P_{0.68}$ having a thickness of 10 nm are laminated alternately. As another structure, the optical amplification layer 19 may be made of a bulk semiconductor, and may be made of $Ga_{0.44}In_{0.56}As_{0.95}P_{0.05}$. The optical amplification layer 19 may be made of the same material as the active layer 3.

The contact layers 7 and 20 are, for example, made of p-type $Ga_{0.47}In_{0.53}As$ crystal. The insulating layer 9 is a protective layer made of an insulator such as SiN or SiO. The heaters 10 are thin film resistors such as TiW. Each heater 10 may extend through a plurality of the segments in the CSG-DBR region B.

The electrodes 8 and 21, the power supply electrode 11 and the ground electrode 12 are made of conductive material such as Au (gold). A reverse face electrode 15 is formed on a lower face of the substrate 1. The reverse face electrode 15 extends through the SG-DFB region A, the CSG-DBR region B and the SOA region C.

The facet film 16 and the facet film 17 are AR films having reflectivity of 1.0% or less, and thereby makes the facet substantially anti-reflection. The AR films may be a dielectric layers made of $MgF_2$, TiON or the like. Although the AR films are provided on the both ends of the laser, the facet film 17 may be a reflection film having a given reflectivity. In case where a semiconductor contacting to the facet film 17 of FIG. 2 has an optical absorption film, when the facet film 17 has a given reflectivity, optical output from the facet film 17 to outward can be suppressed. The given reflectivity is, for example, 10% or more. The reflectivity is a reflectivity with respect to inside of the semiconductor laser.

A plurality of diffraction gratings (corrugations) 18 are formed in the lower cladding layer 2 of the SG-DFB region A and the CSG-DBR region B in a given interval. Thus, the SG-DFB region A and the CSG-DBR region B have sampled gratings. The SG-DFB region A and the CSG-DBR region B have a plurality of segments under the lower cladding layer 2. The segment is a region in which one region having the diffraction grating 18 and one space portion not having the diffraction grating 18 are combined. that is, the segment is a region in which the space portion sandwiched by diffraction grating portions and the diffraction grating portion are combined. The diffraction grating 18 is made of a material having a refractive index that is different from that of the lower cladding layer 2. The material of the diffraction grating 18 is, for example, made of $Ga_{0.22}In_{0.78}As_{0.47}P_{0.53}$ when the lower cladding layer 2 is made of InP.

The diffraction grating 18 may be formed with a patterning with use of a dual beam interference exposure method. The space region between two diffraction gratings 18 may be formed by exposing a resist with a pattern of the diffraction grating 18 and exposing an area of the resist corresponding to the space region after that. A pitch of the diffraction gratings 18 of the SG-DFB region A may be equal to or different from a pitch of the diffraction gratings 18 of the CSG-DBR region B. In the embodiment, as an example, the pitch of the diffraction gratings 18 of the SG-DFB region A is equal to the pitch of the diffraction gratings of the CSG-DBR region B. In each segment, the diffraction gratings 18 may have the same length or may have different length. The diffraction gratings 18 of the SG-DFB region may have the same length. The diffraction gratings 18 of the CSG-DBR region B may have the same length. And the length of the diffraction gratings 18 of the SG-DFB region A may be different from the length of the diffraction gratings of the CSG-DBR region B.

In the SG-DFB region A, each optical length of each segment is substantially equal to each other. In the CSG-DBR region B, at least two of the segments have a different optical length. Thus, peak intensity of wavelength characteristics of the CSG-DBR region B depends on wavelength. An average optical length of the segments of the SG-DFB region A is different from an average optical length of the segments of the CSG-DBR region B. In this manner, the segments of the SG-DFB region A and the segments of the CSG-DBR region B have a laser region (resonator) in the wavelength tunable laser diode 30.

In the SG-DFB region A and the CSG-DBR region B, reflected lights interfere with each other. The SG-DFB region A has the active layer 3. When a carrier is supplied to the active layer 3, discrete gain spectra having a predetermined wavelength interval of which peak intensities are approximately equal to each other are generated. In the CSG-DBR region B, discrete reflection spectra having a predetermined wavelength interval of which peak intensities are different from each other are generated. An interval of the peak wavelengths of the wavelength characteristic of the SG-DFB region A is different from that of the CSG-DBR region B. It is possible to select a wavelength satisfying the oscillation condition, with use of Vernier effect achieved by combining the wavelength characteristics.

FIG. 3 illustrates initial setting values and feedback control target values. As illustrated in FIG. 3, the initial setting values include initial current values $I_{LD}$ supplied to the electrode 8 of the SG-DFB region A, initial current values $I_{SOA}$ supplied to the electrode 21 of the SOA region C, initial temperature values $T_{Etalon}$ of the etalon 54, initial electrical power values $P_{Heater1}$ to $P_{Heater3}$ supplied to the heaters 10. The initial setting values are determined with respect to each oscillation wavelength.

The feedback control target values are target values which are used in the feedback control of the controller 70. The feedback control target values are temperatures $T_{TEC}$ of the temperature adjusting element 42. The temperature of the temperature adjusting element 42 is controlled by measuring the temperature of the thermistor on the temperature adjusting element 42. The control target values are determined with respect to each channel. These values are obtained before shipping the wavelength tunable laser apparatus 100 by tuning with use of a wavelength measure, with respect to each product. As described later, the current ratio $I_{m2}/I_{m1}$ of the current $I_{m2}$ and the current $I_{m1}$ output from the light receiving elements 52 and 56, and the target value are used in the wavelength control.

Next, on the basis of FIG. 1 to FIG. 3, a description will be given of an operation of the wavelength tunable laser apparatus 100 for outputting a grid wavelength. The controller 70 obtains information of a requested channel from outside. The controller 70 obtains the initial setting values and the feedback control target values corresponding to the requested channel from the memory 74, on the basis of the information of the requested channel and stores the values in the RAM. The controller 70 supplies a current according to the initial current $I_{LD}$ corresponding to the channel, to the electrode 8 of the wavelength tunable laser diode 30.

The controller 70 supplies electrical power to the temperature adjusting element 42 so that the initial temperature $T_{Etalon}$ corresponding to the channel is achieved. Thus, the temperature of the wavelength tunable laser diode 30 is controlled to an initial value. The controller 70 supplies the initial electrical powers $P_{Heater1}$ to $P_{Heater3}$ corresponding to the channel to the heaters 10. Thus, the heaters 10 generate heat at a predetermined temperature. When the electrical powers supplied to the heaters 10 are controlled, the temperatures of the segments of the CSG-DBR region B are controlled. Thus, equivalent diffraction indices of the segments vary. And, the reflection characteristics of the segments vary. When the temperature of the temperature adjusting element 42 is controlled and the temperatures of the heaters 10 are controlled, the condition of the wavelength tunable laser diode 30 is controlled to an oscillation condition of the wavelength corresponding to the channel.

The controller 70 supplies the initial current value $I_{SOA}$ corresponding to the channel to the electrode 21 of the SOA region C. Thus, the optical intensity of the laser light emitted from the front of the wavelength tunable laser diode 30 is controlled to an initial value. On the basis of each initial value in this manner, the wavelength tunable laser diode 30 laser-oscillates. However, under the condition, the wavelength is not always equal to the requested wavelength. The power of the emitted light is not always equal to the predetermined power. Therefore, the wavelength and the emitted light power are feedback-controlled.

The controller 70 performed an APC (Auto Power Control) and an AFC (Auto Frequency Control), as the feedback controls. In concrete, as the APC, the controller 70 feedback-controls the current $I_{SOA}$ supplied to the electrode 21 of the SOA region C so that the current output from the light receiving element 52 becomes the current target value $I_{m1-T}$ corresponding to the channel. Thus, the emitted light power from the wavelength tunable laser diode 30 is controlled to a requested value corresponding to the channel.

As the auto frequency control, the controller 70 controls the temperature of the wavelength tunable laser diode 30 so that the ratio (controlled value) $I_{m2}/I_{m1}$ of the current $I_{m2}$ output from the light receiving element 56 with respect to the current $I_{m1}$ becomes the current target value $I_{m2-T}/I_{m1-T}$ corresponding to the target wavelength. Thus, the wavelength of the emitted light of the wavelength tunable laser diode 30 is controlled to a wavelength corresponding to the channel. With the control, the wavelength tunable laser diode 30 can perform the laser oscillation at a requested wavelength.

(Etalon) As mentioned above, the current ratio $I_{m2}/I_{m1}$ is used in the AFC. However, the current $I_{m2}$ output from the light receiving element 56 depends on the permeation characteristic of the etalon 54. The permeation characteristic of the etalon 54 varies in accordance with the temperature of the etalon 54. When the wavelength tunable laser diode 30 is activated, the wavelength tunable laser diode 30 generates heat. When the heat is conducted to the etalon 54, the temperature of the etalon 54 varies. This results in changing of the permeation characteristic of the etalon 54.

Figure 4:
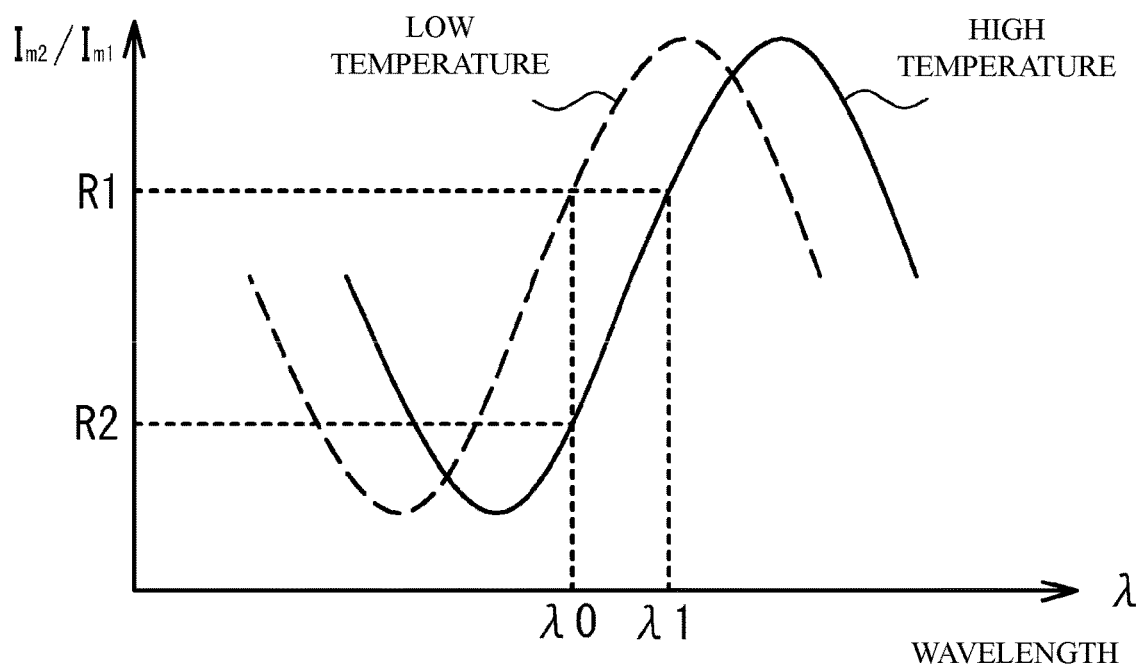
FIG. 4 schematically illustrates permeation characteristic of an etalon.

FIG. 4 schematically illustrates the permeation characteristic of the etalon 54. A horizontal axis indicates a wavelength λ of a light which is emitted from the wavelength tunable laser diode 30. A vertical axis indicates the current ratio $I_{m2}/I_{m1}$. When the intensity of the light received by the light receiving element 56 gets larger, and $I_{m2}$ and $I_{m2}/I_{m1}$ get larger, when the transmissivity of the etalon 54 with respect to the laser light L2 gets higher. Therefore, the transmissivity of the etalon 54 with respect to a wavelength of which the $I_{m2}/I_{m1}$ is large is high. The transmissivity of the etalon 54 with respect to a wavelength of which the $I_{m2}/I_{m1}$ is low. As illustrated in FIG. 4, the etalon 54 has periodical characteristic with respect to a wavelength. The periodical characteristic depends on the temperature of the etalon 54. When the temperature of the etalon 54 is low, the etalon 54 has the characteristic illustrated with a broken line of FIG. 4. When the temperature of the etalon 54 is high, the etalon 54 has the characteristic illustrated with a solid line of FIG. 4.

"λ0" of FIG. 4 is a target wavelength and corresponds to one of channels of FIG. 3. When the etalon 54 has the characteristic illustrated with the broken line, the current ratio $I_{m2}/I_{m1}$ is controlled to R1 corresponding to λ0 in order to the control the wavelength to λ0. However, when the temperature of the etalon 54 increases, the characteristic is transferred from the broken line to the solid line. In this case, when the current ratio is controlled to R1, the wavelength becomes different from λ0 and is changed to λ1.

For example, in the wavelength tunable laser diode 30, the heat is conducted from the SOA region C to the etalon 54. In particular, the wavelength tunable laser diode 30 and the etalon 54 are mounted on the single temperature adjusting element 42. Therefore, the heat is easily conducted. And the permeation characteristic of the etalon 54 easily fluctuates. In the first embodiment, in the characteristic illustrated with the solid line after the changing caused by the heat, the AFC is performed so that R2 corresponding to the target wavelength λ0 is controlled a target value of the current ratio $I_{m2}/I_{m1}$.

Figure 5A:
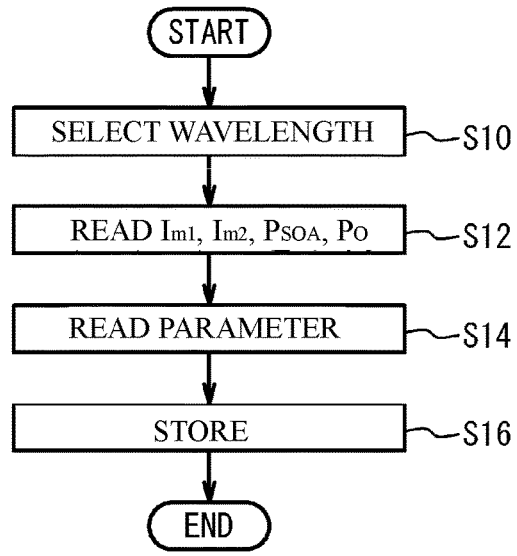
FIG. 5A illustrates a flowchart showing a control for reading parameters.

(Obtaining of parameter) Before the AFC, parameters for calculating the target value of the $I_{m2}/I_{m1}$ are read. FIG. 5A illustrates a flowchart showing a control for reading the parameters. As illustrated in FIG. 5A, the controller 70 selects a wavelength of an emitted light (Step S10). The controller 70 activates the wavelength tunable laser apparatus 100 so as to emit a laser light of the wavelength and changes the current $I_{SOA}$ input to the electrode 21 of the SOA region C to more than three values while the wavelength is maintained. The controller 70 reads the current target value $I_{m1-T}$, the electrical power target value $P_{SOA-T}$ and the emitted light target value $P_{O-T}$ in each case (Step S12). The current $I_{m1}$ and the current $I_{m2}$ are obtained from the light receiving element 52 and the light receiving element 56. The electrical power $P_{SOA}$ input to the SOA region C is obtained from the current $I_{SOA}$ and the voltage $V_{SOA}$. The emitted light power $P_0$ of the wavelength tunable laser apparatus 100 is obtained from the current $I_{m1}$ and the electrical power $P_{SOA}$, or an external measurement device or the like.

The controller 70 obtains parameters a1 to a3, b1 to b3 and c1 to c3, on the basis of the current Im1, the current Im2, the electrical power $P_{SOA}$ and the emitted light power Po (Step S14). The memory 74 stores the parameters (Step S16). After that, the control is terminated. The controller 70 performs the processes of FIG. 5A, with respect to each wavelength of each channel of FIG. 3. And the controller 70 calculates parameters corresponding to each wavelength. The memory 74 stores the calculated parameters.

The wavelength of the emitted light is maintained. Under the condition, the current $I_{m1}$ and the current $I_{m2}$ are expressed by a function of the electrical power $P_{SOA}$ and the emitted light power $P_O$. Thus, the wavelength tunable laser apparatus 100 is activated at the wavelength, and the wavelength tunable laser apparatus 100 generates the heat. Under the condition, the current target value $I_{m1-T}$ and the current target value $I_{m2-T}$ are obtained, on the basis of the characteristic of the etalon 54. And, the target value $I_{m1}/I_{m2}$ is obtained. The electrical power target value $P_{SOA-T}$ can be expressed by the function of the emitted light power $P_O$. The parameters a1 to a3, b1 to b3 and c1 to c3 obtained in the control of FIG. 4 are used in the relationships.

That is, as expressed by the following formula, the current target value $I_{m1-T}$ is expressed by the function of the electrical power $P_{SOA}$ and the emitted light power $P_O$, with use of the parameters a1, b1 and c1.

$$I_{m1-T}=a1\times P_{SOA}+b1\times P_0+c1 \quad \text{[Formula 1]}$$

The current target value $I_{m2-T}$ is expressed by the function of the electrical power $P_{SOA}$ and the emitted light power $P_O$, with use of the parameters a2, b2 and c2.

$$I_{m2-T}=a2\times P_{SOA}+b2\times P_0+c2 \quad \text{[Formula 2]}$$

The electrical power target value $P_{SOA-T}$ is expressed by the function of the emitted light power $P_O$ with use of the parameters a3, b3 and c3.

$$P_{SOA-T}=a3\times P_0^2+b3\times P_0+c3 \quad \text{[Formula 3]}$$

Figure 5B:
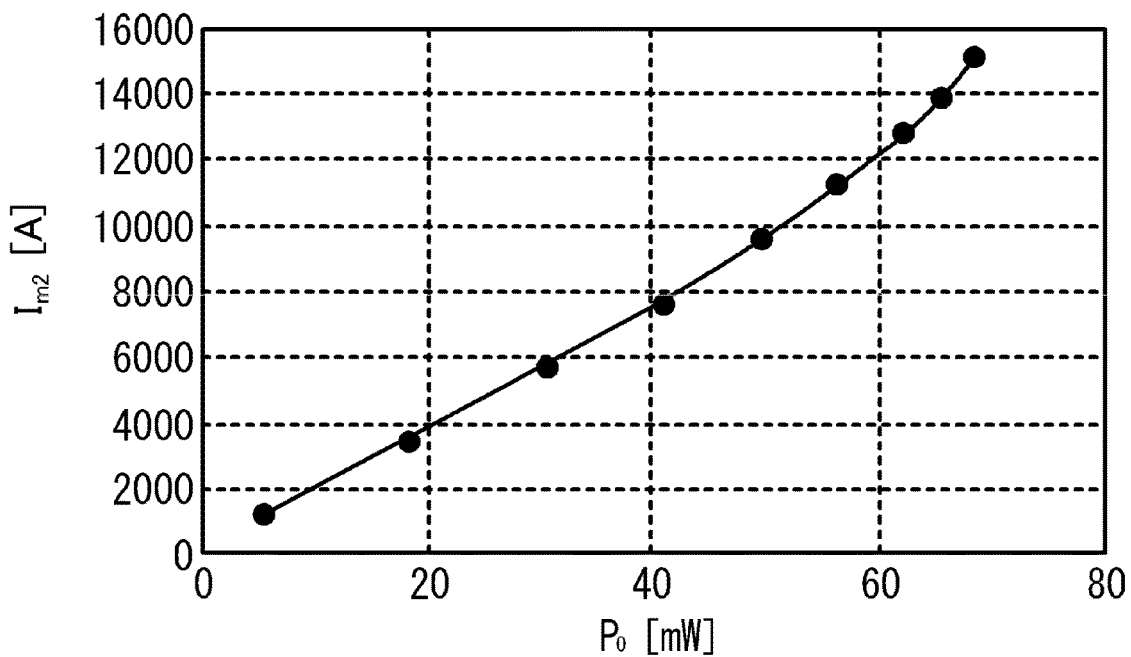
FIG. 5B illustrates measured results of emitted light power and current.

FIG. 5B illustrates measured results of the emitted light power $P_O$ and the current $I_{m2}$. Circles indicate the measured results. A solid line indicates the fitting result with respect to the measured results. The above-mentioned parameters are calculated from the fitting of FIG. 5B. FIG. 5B illustrates an example of the current $I_{m2}$. It is possible to calculate the parameters with respect to the current $I_{m1}$ and the electrical power $P_{SOA}$ with the same manner.

FIG. 6 illustrates the parameters. The controller 70 reads the parameters a1 to a3, b1 to b3 and c1 to c3, with respect to each channel. And the memory 74 stores a data table illustrated in FIG. 6.

Figure 7:
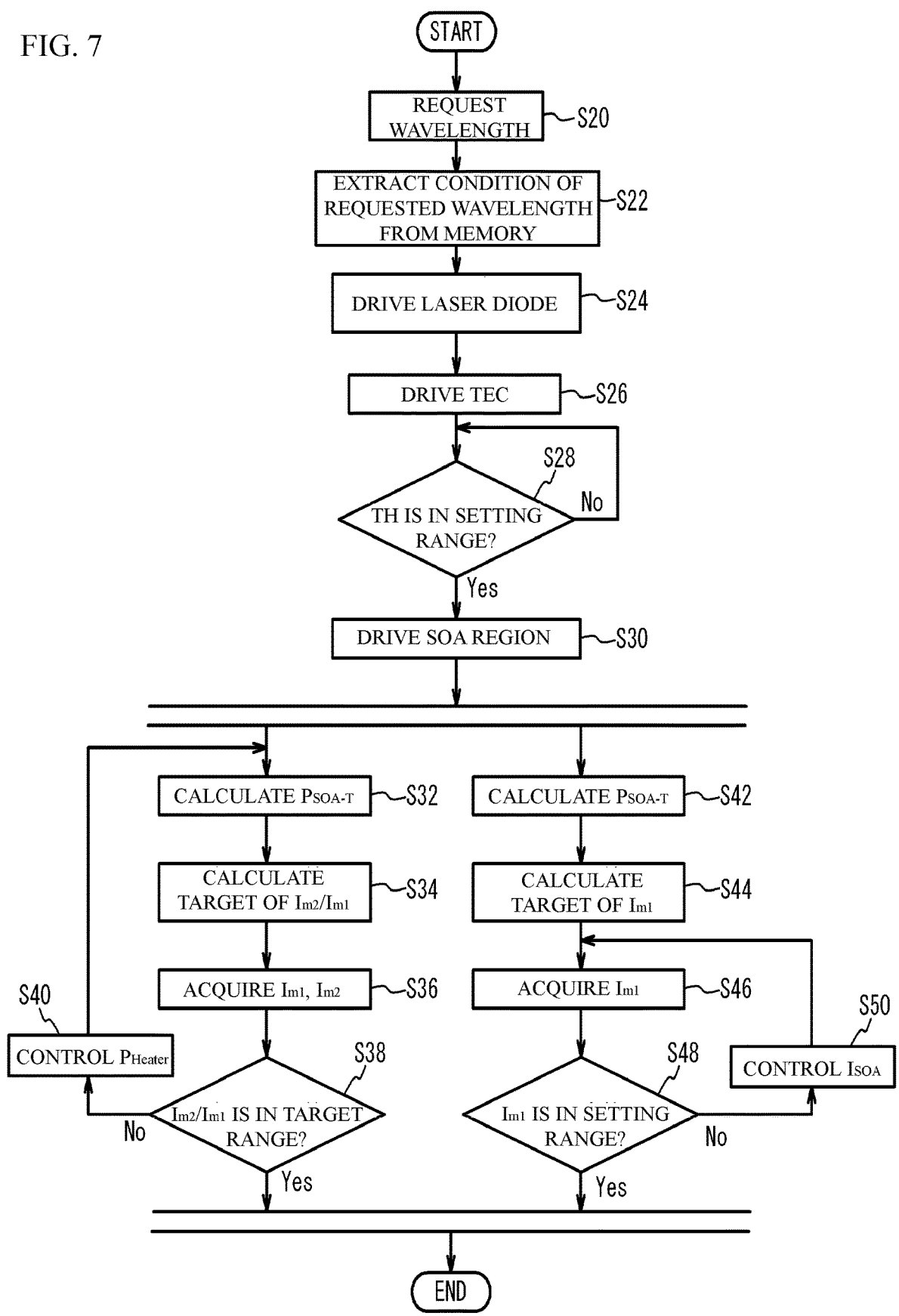
FIG. 7 illustrates a flowchart of a control of a controller.

(AFC and APC) FIG. 7 illustrates a flowchart of a control of the controller 70. The flowchart includes the AFC and the APC. Before starting of the control of FIG. 7, the control of FIG. 4 is performed. A target emitted light power of the wavelength tunable laser apparatus 100 is input to the controller 70 or the like.

As illustrated in FIG. 7, the controller 70 receives a wavelength request (Step S20). The requested wavelength is input from an external input/output device. For example, the requested wavelength corresponds to one of wavelengths of the channels of FIG. 3. In the example of FIG. 4, the requested wavelength corresponds to A0 and a target wavelength of the AFC.

The controller 70 extracts a control condition corresponding to the target wavelength, from the memory 74 (Step S22). The controller 70 reads the initial setting values and the feedback control target values of FIG. 3 and the parameters of FIG. 5 corresponding to the target wavelength from the memory 74 and stores them in the RAM 72.

Next, the controller 70 supplies a current to the electrode 8 of the SG-DFB region A and applies electrical power to the heaters 10 of the CSG-DBR region B. Thus, the controller 70 activates the wavelength tunable laser diode 30 (Step S24). The controller 70 does not supply a current to the electrode 21 of the SOA region C. Moreover, the controller 70 activates the temperature adjusting element 42 (TEC) (Step S26). The current and the electrical power are the initial setting values of FIG. 3 corresponding to the requested wavelength.

The controller 70 determines whether the detected temperature TH of the thermistor 58 is within a setting range (Step S28). The setting range is a predetermined range of which a center is the target temperature $T_{LD}$. When it is determined as "No" in Step S4, the controller 70 changes the current supplied to the temperature adjusting element 42 so that the temperature TH becomes within the setting range.

When it is determined as "Yes" in Step S28, the controller 70 supplies a current to the electrode 21 of the SOA region C and activates the SOA region C (Step S30). At this time, a reverse bias is applied to the SOA region C, and thereby the SOA region C absorbs a light so that the wavelength tunable laser diode 30 does not emit a light. In this case, the wavelength tunable laser diode 30 generates heat. However, it is possible to suppress influence of the heat generated by the wavelength tunable laser diode 30, by calculating the current target value $I_{m1-T}$ and the current target value $I_{m2-T}$.

Next, the controller 70 performs both the AFC and the APC in parallel. First, a description will be given of the AFC. The controller 70 uses the target value $P_{O-T}$ of the emitted light power and the formula 3, and calculates the target value $P_{SOA-T}$ of the electrical power which is a drive condition of the wavelength tunable laser diode 30 (Step S32). After that, the controller 70 uses the target value $P_{O-T}$ of the emitted light power, the target value $P_{SOA-T}$ of the electrical power, the formula 1 and the formula 2, and calculates the current target value and the current target value $I_{m2-T}$. And the controller 70 calculates the target value $I_{m2-T}/I_{m1-T}$ which is a ratio of the current target value $I_{m1-T}$ and the current target value $I_{m2-T}$ (Step S34). The calculated target value corresponds to the target wavelength and corresponds to the changing of the permeation characteristic of the etalon 54 caused by the heat, and corresponds to R2 in FIG. 4. In the embodiment, the target value $P_{O-T}$ of the emitted light power is extracted from the memory 74. However, the target value $P_{O-T}$ may be supplied from an external device.

The controller 70 obtains the current $I_{m1}$ and the current $I_{m2}$ from the light receiving elements 52 and 56 (Step S36), and calculates the ratio $I_{m2}/I_{m1}$. The controller 70 determines whether the ratio $I_{m2}/I_{m1}$ obtained in Step S36 is within a target value range (Step S38). For example, the target value range is a predetermined range of which a center is the target value obtained in Step S34.

When it is determined as "No" in Step S38, the controller 70 controls electrical power $P_{Heater}$ applied to the heaters 10, on the basis of a difference between the ratio $I_{m2}/I_{m1}$ and the target value $I_{m2-T}/I_{m1-T}$ (Step S40). The electrical power $P_{Heater}$ includes $P_{Heater1}$ to $P_{Heater3}$ illustrated in FIG. 3. By the control of the electrical power $P_{Heater}$, the refractive index of the optical waveguide layer 4 of the CSG-DBR region B changes, and the oscillation wavelength of the wavelength tunable laser diode 30 changes. Thus, the ratio $I_{m2}/I_{m1}$ obtained in Step S36 changes. These steps are repeated until the ratio $I_{m2}/I_{m1}$ is within the target value range. After the ratio $I_{m2}/I_{m1}$ is within the target value range, the AFC is continued so that the ratio $I_{m2}/I_{m1}$ is within the target value range.

Next, a description will be given of the APC. The controller 70 uses the target value $P_{O-T}$ of the emitted light power and the formula 3 and calculates the electrical power target value $P_{SOA-T}$ which is the drive condition of the wavelength tunable laser diode 30 (Step S42). In the embodiment, the target value $P_{O-T}$ of the emitted light power is extracted from the memory 74. However, the target value $P_{O-T}$ may be supplied from an external device. After that, the controller 70 uses the target value $P_{O-T}$ of the emitted light power, the electrical power target value $P_{SOA-T}$, and the formula 1, and calculates the target value $I_{m1-T}$ of the current $I_{m1}$ (Step S44). After that, the controller 70 obtains the current $I_{m1}$ from the light receiving element 52 (Step S46). And, the controller 70 determines whether the current $I_{m1}$ is within a setting range (Step S48). The setting range of the current $I_{m1}$ is a predetermined range of which a center is the current target value $I_{m1-T}$. When it is determined as "No" in Step S48, the controller 70 controls the current $I_{SOA}$ to the SOA region C, in accordance with a difference between the current $I_{m1}$ and the feedback control value (Step S50). These steps are repeated until the current $I_{m1}$ is within the setting range. After the current $I_{m1}$ is within the setting range, the APC is continued so that the current $I_{m1}$ is within the setting range. When it is determined as "Yes" in Step S38 and Step S42, the control is terminated.

Figure 8A:
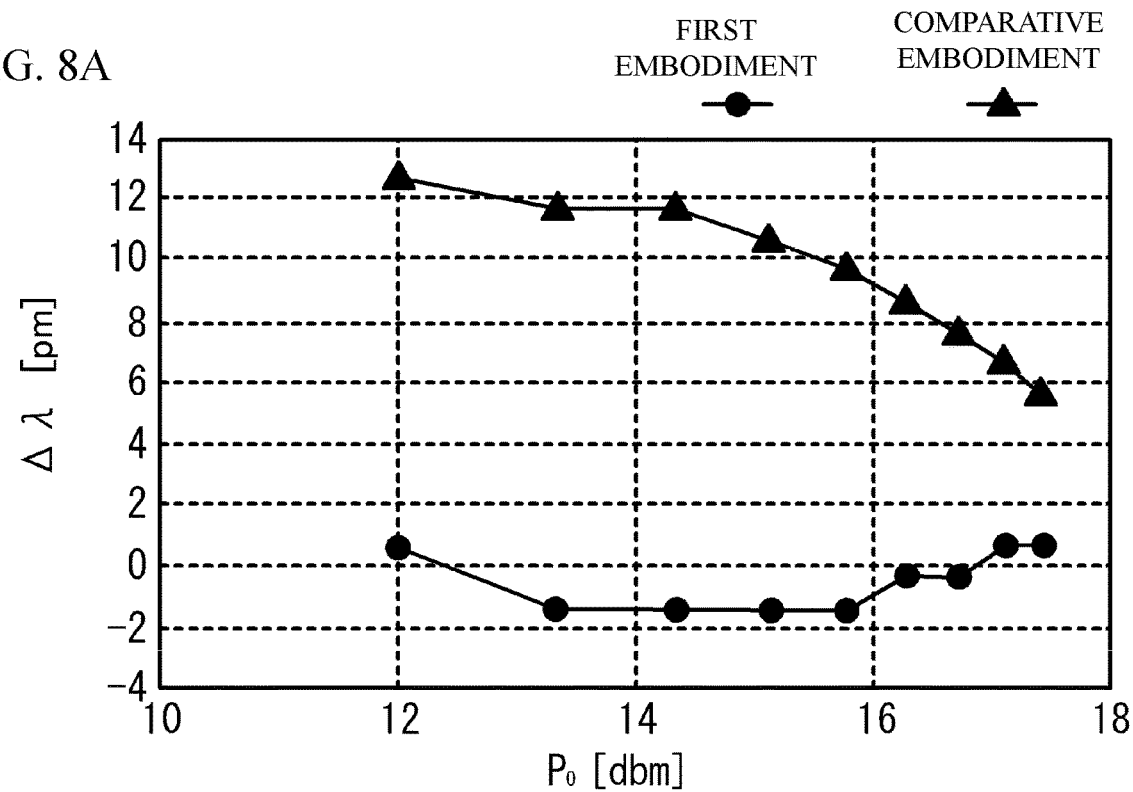
FIG. 8A and FIG. 8B illustrate measured results of a wavelength.
Figure 8B:
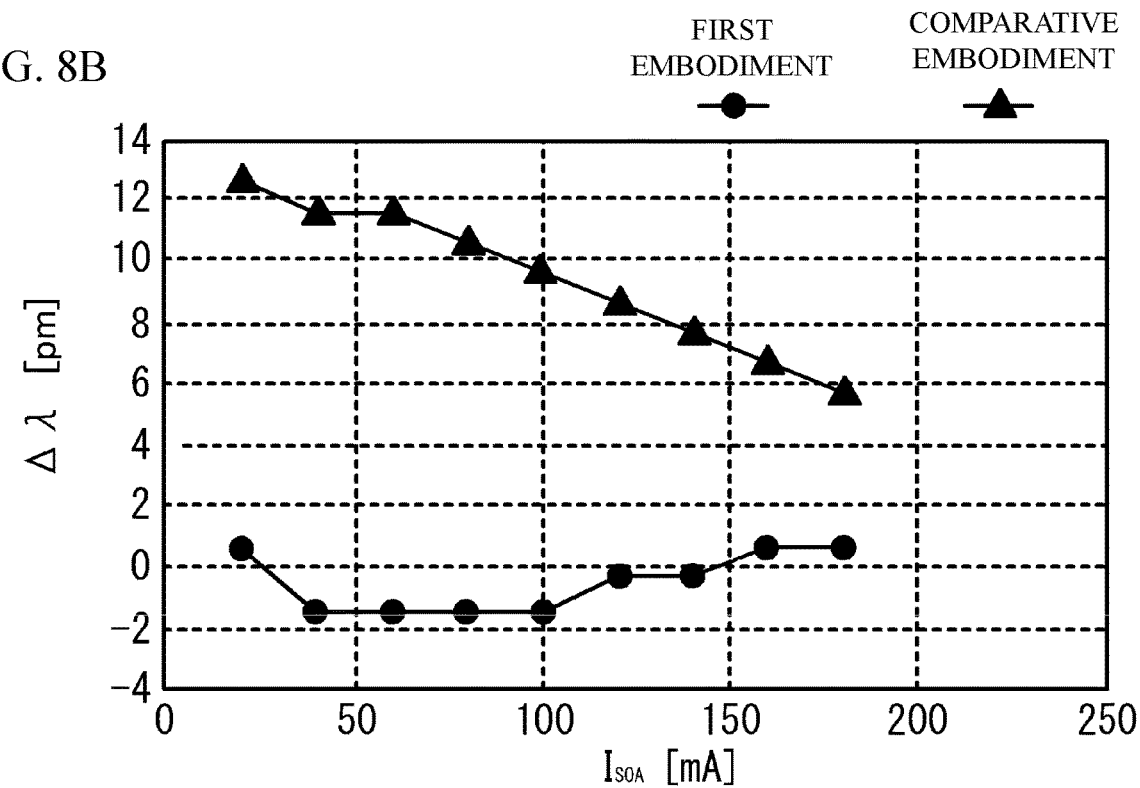

FIG. 8A and FIG. 8B illustrate measured results of the wavelength. In FIG. 8A and FIG. 8B, circles are the results of the first embodiment. Triangles are the results of a comparative embodiment. A structure of a wavelength tunable laser device of the comparative embodiment is the same as that of the first embodiment. In the first embodiment, the controller 70 performs the control of FIG. 7. On the other hand, in the comparative embodiment, the controller 70 determines a target value of the ratio of $I_{m2}/I_{m1}$ which corresponds to the target wavelength of the wavelength tunable laser apparatus by tuning with use of a wavelength measurer and stores the target value in the memory 74. The controller 70 does not perform the control of FIG. 7 and performs a control in which a value becomes a stored target value.

A horizontal axis of FIG. 8A is the emitted light power $P_O$. A horizontal axis of FIG. 8B is the current $I_{SOA}$. Vertical axes of FIG. 8A and FIG. 8B are the difference Δλ between the target wavelength and the wavelength. The target wavelength is 1567.952 nm. As illustrated in FIG. 8A and FIG. 8B, in the comparative embodiment, a wavelength gap is 5 pm or more. On the other hand, in the first embodiment, the wavelength gap is within ±2 pm.

In the first embodiment, the controller 70 obtains the target wavelength, calculates the target value $P_{SOA-T}$ which is a drive condition of the wavelength tunable laser diode 30, and calculates the target value $I_{m2-T}/I_{m1-T}$ from the target value $I_{m2-T}$ and the target value $I_{m1-T}$ by using the formula 1 and the formula 2. Moreover, the controller 70 obtains the $I_{m1}$ and the $I_{m2}$ and controls the current ratio so that the current ratio is within a predetermined range from the target value. By the AFC using the target value in accordance with the heat of the wavelength tunable laser diode 30, it is possible to control the wavelength of the emitted light of the wavelength tunable laser apparatus 100 to a target value with high accuracy.

In concrete, the target value $I_{m1-T}$ and the target value $I_{m2-T}$ are expressed as functions of the target value $P_{O-T}$ of the emitted light power and the target electrical power $P_{SOA-T}$, by using the parameters of FIG. 6, the formula 1 and the formula 2. Thus, the target value $I_{m1-T}$ and the target value $I_{m2-T}$ for keeping a constant wavelength under influence of the heat of the wavelength tunable laser diode 30 are obtained. And, the target value of $I_{m2-T}/I_{m1-T}$ is obtained. In the AFC, the measured value $I_{m1}$ and the measured value $I_{m2}$ are obtained. When the current ratio $I_{m2}/I_{m1}$ gets closer to the target value, the wavelength can be controlled to the target wavelength.

The controller 70 calculates the target electrical power $P_{SOA-T}$ which is to be input to the SOA region C, by using the formula 3. And, the target vale $I_{m1-T}$ and the target value $I_{m2-T}$ are obtained by using the target electrical power $P_{SOA-T}$, the target wavelength, the formula 1 and the formula 2. And, the target ratio $I_{m2-T}/I_{m1-T}$ is calculated as a current ratio. The target value in accordance with the influence of the heat of the SOA region C caused by the supply of the electrical power $P_{SOA}$ is obtained. Therefore, the accuracy of the AFC is improved. For example, the controller 70 may calculate the target value by using at least one of the current and the voltage which are supplied to the SOA region C.

The controller 70 expresses the target value $I_{m1-T}$ as a function of the target value $P_{O-T}$ of the optical emitted power and the target electrical power $P_{SOA-T}$, by using the formula 1 and the formula 3. Thus, the target value $I_{m1-T}$ for keeping the constant wavelength under the influence of the heat of the wavelength tunable laser diode 30 is obtained. The target value $I_{m1-T}$ is obtained by the APC. When the current $I_{m1}$ gets closer to the target value, it is possible to control the optical emitted power to a desired value.

The controller 70 controls the electrical power $P_{Heater1}$ to the electrical power $P_{Heater3}$ which are input to the heaters 10 provided on the CSG-DBR region B of the wavelength tunable laser diode 30. Thus, the refractive index of the CSG-DBR region B is changed. And the wavelength of the light emitted by the wavelength tunable laser diode 30 can be controlled. For example, the $I_{LD}$ or the like other than the electrical power $P_{Heater1}$ to the electrical power $P_{Heater3}$ input to the heaters 10 may be changed.

The laser light L1 is input to the light receiving element 52. The laser light L2 passes through the etalon 54 and is input to the light receiving element 56. When the heat of the wavelength tunable laser diode 30 is conducted to the etalon 54, the permeation characteristic of the etalon 54 fluctuates. In particular, the wavelength tunable laser diode 30 and the etalon 54 are mounted on the single temperature adjusting element 42. Therefore, the heat is easily conducted to the etalon 54. In the first embodiment, the AFC is performed with use of the target value corresponding to the changing of the permeation characteristic of the etalon 54. It is therefore possible to control the wavelength with high accuracy.

The current $I_{m1}$ and the current $I_{m2}$ are expressed as functions of the electrical power $P_{SOA}$ which is input to the SOA region C of the wavelength tunable laser diode 30. And, the AFC which is corrected with respect to the heat from the SOA region C is performed. For example, electrical signals input to regions other than the SOA region C are used, and heat from the regions may be corrected. Although the wavelength tunable laser diode 30 has the SG-DFB region A, the CSG-DBR region B and the SOA region C in the embodiment, the structure is not limited. For example, a TDA-DFB (Tunable Distributed Amplified-DFB) region in which heaters are provided on the active layer 3 may be provided instead of the SG-DFB region A. The semiconductor layers in the wavelength tunable laser diode 30 may be made of compound semiconductors other than the above-mentioned semiconductors. The positions and the number of the components in the case 40 may be changed.

Second Embodiment

Figure 9:
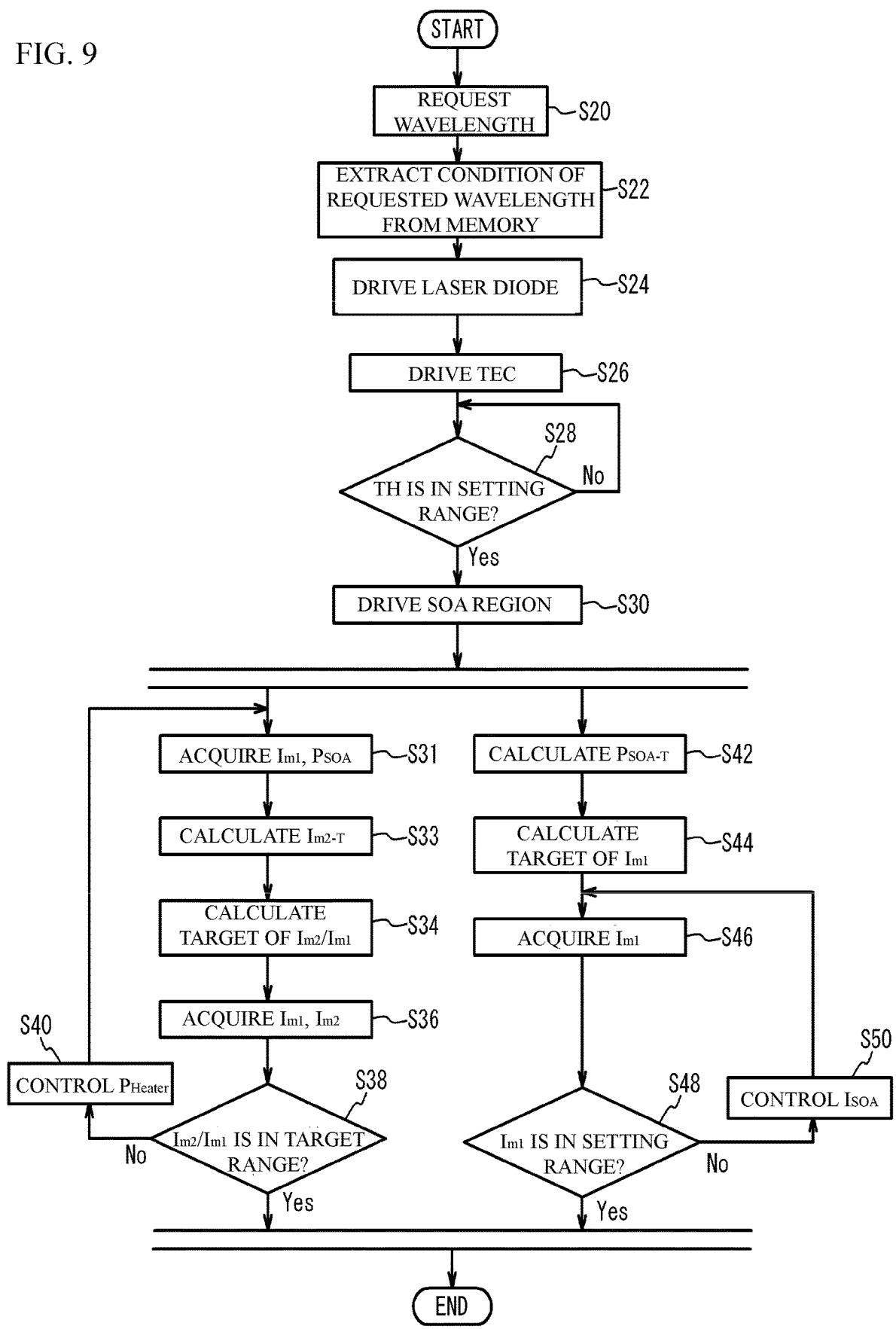
FIG. 9 illustrates a flowchart performed by a controller.

The structures of the wavelength tunable laser apparatus 100 and the wavelength tunable laser diode 30 are the same as those of the first embodiment. The control of FIG. 5A is also performed in the second embodiment. FIG. 9 illustrates a flowchart performed by the controller 70. Step S20 to Step S30, Step S42 and Step S44 are the same as those of FIG. 7.

A description will be given of the AFC in the second embodiment. As illustrated in FIG. 9, the controller 70 obtains the current $I_{m1}$ and the electrical power $P_{SOA}$ (Step S31). The controller 70 calculates the current target value by using the current $I_{m1}$, the electrical power $P_{SOA}$ and the formula 2 (Step S33). The controller 70 calculates the target value $I_{m2-T}/I_{m1-T}$ of the current ratio $I_{m2}/I_{m1}$ (Step S34). The $I_{m1}$ for calculating the current target value $I_{m2-T}$ by using the formula 2 may be the current target value $I_{m1-T}$ calculated from the formula 1 or may be the current $I_{m1}$ obtained in Step S31.

The controller 70 obtains the current $I_{m1}$ and the current $I_{m2}$ from the light receiving element 52 and the light receiving element 56 (Step S36), and calculates the current ratio $I_{m2}/I_{m1}$. The controller 70 determines whether the current ratio $I_{m2}/I_{m1}$ obtained in Step S36 is within a target range (Step S38). When it is determined as "No" in Step S38, the controller 70 controls the electrical power $P_{Heater}$ applied to the heater 10, on the basis of a difference between the current ratio $I_{m2}/I_{m1}$ and the target current ratio $I_{m2-T}/I_{m1-T}$ (Step S40). These steps are repeated until the current ratio $I_{m2}/I_{m1}$ is within a target range. After the current ratio $I_{m2}/I_{m1}$ is within the target range, the AFC is continued so that the current ratio $I_{m2}/I_{m1}$ is within the target range.

The controller 70 obtains the electrical power $P_{SOA}$ input to the SOA region C and calculates the current target ratio $I_{m2-T}/I_{m1-T}$ by using the $P_{SOA}$ and the formula 1. In the second embodiment, as well as the first embodiment, it is possible to control the wavelength of the light emitted by the wavelength tunable laser apparatus 100 to a target wavelength. The AFC is performed by using the target value in accordance with the heat of the SOA region C caused by the supply of the electrical power $P_{SOA}$. Therefore, the accuracy of the AFC is improved.

Next, a description will be given of the APC of the second embodiment. The controller 70 uses the target value $P_{O-T}$ of the optical emitted power and the formula 3, and calculates the electrical power target value $P_{SOA-T}$ which is a drive condition of the wavelength tunable laser diode 30 (Step S42). The target value $P_{O-T}$ of the optical emitted power is extracted from the memory 74 in the embodiment. However, the target value $P_{O-T}$ may be input from an external device. After that, the controller 70 uses the target value $P_{O-T}$ of the optical emitted power, the electrical power target value $P_{SOA-T}$ and the formula 1, and calculates the target value $I_{m1-T}$ of the current $I_{m1}$ (Step S44). After that, the controller 70 obtains the current $I_{m1}$ from the light receiving element 52 (Step S46).

And, the controller 70 determines whether the current $I_{m1}$ is within a setting range (Step S48). The setting range of the current $I_{m1}$ is a predetermined range of which a center is the current target value $I_{m1-T}$. When it is determined as "No" in step S48, the controller 70 controls the current $I_{SOA}$ to the SOA region C, on the basis of a difference between the current $I_{m1}$ and the feedback control value (Step S50). These steps are repeated until the current $I_{m1}$ is within the setting range. After the current $I_{m1}$ is within the setting range, the APC is continued so that the current $I_{m1}$ is within the setting range. When it is determined as "Yes" in Step S38 and Step S48, the control is terminated.

Although the embodiments of the present invention have been described in detail, it is to be understood that the various change, substitutions, and alterations could be made hereto without departing from the spirit and scope of the invention.

What is claimed is:

1. A method to tune an emission wavelength of a laser apparatus that includes a wavelength tunable laser diode that emits laser beam,
    an etalon that receives emitted laser beam of the wavelength tunable laser diode and changes transmissivity in accordance with a wavelength of the emitted laser beam,
    a first photodetector that outputs a first current based on the emitted laser beam that is output from the wavelength tunable laser diode,
    a second photodetector that outputs a second current based on a transmitted light that is output from the etalon, the method comprising steps of:
    acquiring a target wavelength of the wavelength tunable laser diode to make the wavelength tunable laser diode oscillate at a target wavelength;
    acquiring a drive condition of the wavelength tunable laser diode based on the target wavelength;
    driving the wavelength tunable laser diode based on the drive condition of the wavelength tunable laser diode;
    acquiring a measured value of the first current measured by the first photodetector, a measured value of the second current measured by the second photodetector and a measured value of the drive condition of the wavelength tunable laser diode;
    determining the measured value of the first current measured by the first photodetector as a first target value of the first photodetector;
    calculating a second target value of the second current from the measured value of the drive condition and the target value of the first current; and
    coinciding a ratio of the measured value of the first current measured by the first photodetector with respect to the measured value of the second current measured by the second photodetector, to a ratio of the first target of the first current with respect to the second target of the second current, by changing the drive condition.

2. The method of claim 1,
wherein the wavelength tunable laser diode has an optical semiconductor amplifier that adjusts an optical magnitude of the laser beam that is output by a laser region of the wavelength tunable laser diode;
wherein the step of acquiring the drive condition of the wavelength tunable laser diode includes steps of:
acquiring a value of an electrical signal input into the optical semiconductor amplifier,
wherein the step of calculating the second target value of the second photodetector includes steps of:
calculating the second target value of the second current based on the measured value of the first current measured by the first photodetector and the value of the electrical signal of the optical semiconductor amplifier.

3. The method of claim 2,
wherein the value of the electrical signal of the optical semiconductor amplifier is electrical power that is input to the optical semiconductor amplifier.

4. A method to tune an emission wavelength of a laser apparatus that includes a wavelength tunable laser diode that emits laser beam,
an etalon that receives emitted laser beam of the wavelength tunable laser diode and changes transmissivity in accordance with a wavelength of the emitted laser beam,
a first photodetector that outputs a first current based on the emitted laser beam that is output from the wavelength tunable laser diode,
a second photodetector that outputs a second current based on a transmitted light that is output from the etalon, the method comprising steps of:
acquiring a target value of an optical magnitude and a target value of a wavelength of the emitted laser beam of the wavelength tunable laser diode;
acquiring a drive condition based on the target wavelength of the wavelength tunable laser diode;
calculating a target value of the drive condition of the wavelength tunable laser based on the target value of the optical magnitude of the emitted laser beam;
calculating a target value of the first current of the first photodetector and a target value of the second current of the second photodetector from the target value of the optical magnitude and the drive condition of the target wavelength of the wavelength tunable laser diode;
acquiring each measured value of the first and second current measured by the first and second of photodiode; and
coinciding a ratio of the first current measured by the first photodetector with respect to the second current measured by the second photodetector, to a ratio of the target value of the first current with respect to the target value of the second current by changing the drive condition.

5. The method of claim 4,
wherein the wavelength tunable laser diode has an optical semiconductor amplifier that adjusts an optical magnitude of the laser beam that is output by a laser region of the wavelength tunable laser diode;
wherein the step of acquiring the drive condition of the wavelength tunable laser diode includes steps of:
acquiring a target value of an electrical signal input into the optical semiconductor amplifier, as the drive condition,
wherein the step of calculating the target value of the first current and the target value of the second current includes steps of:
calculating the target value of the first current and the target value of the second current from the target value of the electrical signal.

* * * * *